United States Patent
Nagumo

(10) Patent No.: US 10,020,399 B2
(45) Date of Patent: Jul. 10, 2018

(54) SEMICONDUCTOR DEVICE HAVING COMPRESSIVELY STRAINED CHANNEL REGION AND METHOD OF MAKING SAME

(71) Applicant: Renesas Electronics Corporation, Kanagawa (JP)

(72) Inventor: Toshiharu Nagumo, Kanagawa (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/188,835

(22) Filed: Feb. 25, 2014

(65) Prior Publication Data

US 2014/0239399 A1    Aug. 28, 2014

Related U.S. Application Data

(60) Provisional application No. 61/770,173, filed on Feb. 27, 2013.

(51) Int. Cl.
| | |
|---|---|
| *H01L 29/78* | (2006.01) |
| *H01L 29/66* | (2006.01) |
| *H01L 29/10* | (2006.01) |

(52) U.S. Cl.
CPC ........ *H01L 29/785* (2013.01); *H01L 29/1054* (2013.01); *H01L 29/66795* (2013.01)

(58) Field of Classification Search
CPC ............. H01L 27/0886; H01L 27/0924; H01L 27/10826; H01L 27/10879; H01L 27/1211; H01L 29/41791; H01L 29/66795; H01L 29/7831; H01L 29/785
See application file for complete search history.

(56) References Cited

U.S. PATENT DOCUMENTS

| | | | | |
|---|---|---|---|---|
| 8,759,923 | B2* | 6/2014 | Zhong | ............. H01L 29/665 257/288 |
| 9,012,276 | B2* | 4/2015 | Kapoor | ............ H01L 29/78654 438/198 |
| 2005/0224800 | A1* | 10/2005 | Lindert et al. | .................. 257/66 |
| 2005/0263795 | A1 | 12/2005 | Choi et al. | |
| 2009/0149012 | A1* | 6/2009 | Brask et al. | .................. 438/595 |
| 2012/0025312 | A1* | 2/2012 | Scheiper et al. | ............. 257/347 |
| 2012/0196425 | A1 | 8/2012 | Scheiper et al. | |
| 2012/0315732 | A1 | 12/2012 | Kang et al. | |
| 2013/0270628 | A1* | 10/2013 | Huang | ................ H01L 29/0847 257/329 |

(Continued)

OTHER PUBLICATIONS

Japanese Office Action dated Aug. 1, 2017 in corresponding Japanese Patent Application No. 2014-029186 with English translation of Japanese Office Action.

*Primary Examiner* — Benjamin Sandvik
(74) *Attorney, Agent, or Firm* — Young & Thompson

(57) ABSTRACT

A semiconductor device and method making it utilize a three-dimensional channel region comprising a core of a first semiconductor material and an epitaxial covering of a second semiconductor material. The first and second semiconductor materials have respectively different lattice constants, thereby to create a strain in the epitaxial covering. The devices are formed by a gate-last process, so that the second semiconductor material is deposited only after the high temperature processes have been performed. Consequently, the lattice strain is not substantially relaxed, and the improved performance benefits of the lattice strained channel region are not compromised.

20 Claims, 21 Drawing Sheets

(56) References Cited

U.S. PATENT DOCUMENTS

| | | | | |
|---|---|---|---|---|
| 2013/0341639 A1* | 12/2013 | Toh | ................... | H01L 29/66545 |
| | | | | 257/77 |
| 2014/0027816 A1* | 1/2014 | Cea et al. | ..................... | 257/192 |
| 2014/0145242 A1* | 5/2014 | Huang | ............ | H01L 21/823807 |
| | | | | 257/192 |
| 2014/0335673 A1* | 11/2014 | Kim | ................. | H01L 29/66545 |
| | | | | 438/283 |

* cited by examiner

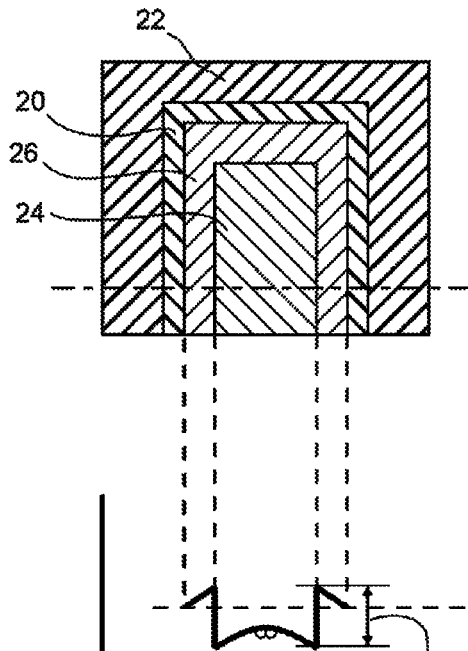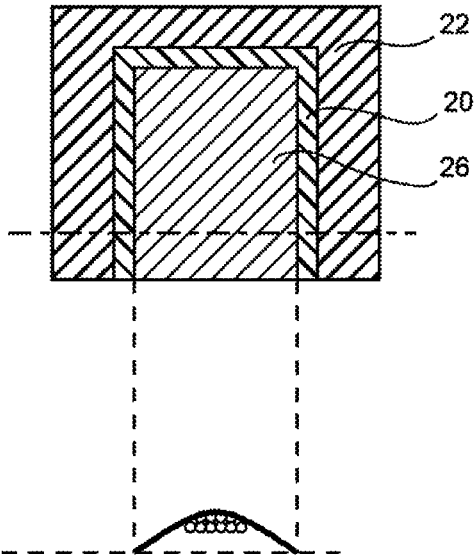
Energy for hole    *Fig. 62*    Si/SiGe valence band energy offset    *Fig. 63*
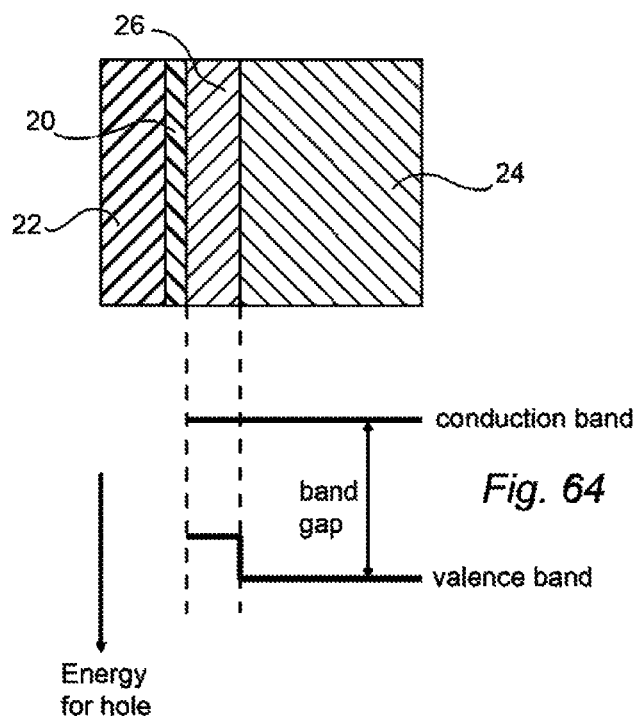
*Fig. 64*
Energy for hole

SEMICONDUCTOR DEVICE HAVING COMPRESSIVELY STRAINED CHANNEL REGION AND METHOD OF MAKING SAME

BACKGROUND OF THE INVENTION

1. Field of the Invention

The invention relates to semiconductor devices and methods of making the same, and more particularly relates to such devices and methods in which a transistor channel region is compressively strained.

2. Description of Related Art

As the gate length of transistors continues to decrease with successive generations of semiconductor devices, new transistor configurations have been needed to counteract the diminished response that would otherwise occur with shrinking gate lengths. One such design configuration is referred to variously as a FinFET or tri-gate transistor, in which the source, drain and channel region of each transistor is elevated relative to a semiconductor substrate. The elevated portion has the shape of a ridge or fin, and may be formed integrally with the underlying substrate or may be formed on an insulating layer in the case of SOI type devices. The gate wraps around the three projecting sides of the fin, and so the available channel area is increased by the gate contacting not only the top part of the fin but also its side walls.

Previous designs for FinFETs have also utilized a strained lattice configuration, for example by replacing all or part of the silicon fin with a silicon germanium epitaxial layer. The wider lattice constant of SiGe relative to silicon causes a compressive strain to be imparted to the SiGe layer formed epitaxially on silicon, which enhances hole mobility in the channel region and thus enhances pFET drive current relative to an unstrained Si channel. See, Smith et al., "Dual Channel FinFETs as a Single High-k/Metal Gate Solution Beyond 22 nm Node," 2009 *IEDM*, pp. 309-312.

However, previous design efforts will likely not meet the demands of future generations of semiconductor devices with respect to minimizing off-current while maximizing on-current and switching speed, especially as gate lengths decrease to 14 nm and below.

SUMMARY OF THE INVENTION

Thus, in one aspect, the present invention relates to a semiconductor device, comprising a three-dimensional channel region comprising a core of a first semiconductor material and an epitaxial covering of a second semiconductor material. The first and second semiconductor materials have respectively different lattice constants, thereby to create a strain in the epitaxial covering. A source region is positioned adjacent one end of the three dimensional channel region, and a drain region is positioned adjacent an opposite end of the three dimensional channel region. A gate electrode is superposed on the three dimensional channel region. The second semiconductor material is present only in a region underlying the gate electrode.

In preferred embodiments of the semiconductor device according to the present invention, each of the core and the epitaxial covering projects upwardly relative to an underlying substrate.

In preferred embodiments of the semiconductor device according to the present invention, the core is formed integrally with an underlying substrate of the first semiconductor material.

In preferred embodiments of the semiconductor device according to the present invention, the core is formed on an insulating layer of a semiconductor on insulator (SOI) substrate.

In preferred embodiments of the semiconductor device according to the present invention, each of the three-dimensional channel region, the source region, the drain region and the gate electrode are separated from an underlying substrate by the insulating layer, thereby to form a transistor that is full isolated from the underlying substrate.

In preferred embodiments of the semiconductor device according to the present invention, the second semiconductor material has a larger lattice constant than the first semiconductor material, thereby to create a compressive strain in the epitaxial covering.

In preferred embodiments of the semiconductor device according to the present invention, the first semiconductor material comprises silicon and the second semiconductor material comprises silicon and germanium.

In preferred embodiments of the semiconductor device according to the present invention, the second semiconductor material has a smaller lattice constant than the first semiconductor material, thereby to create a tensile strain in the epitaxial covering.

In preferred embodiments of the semiconductor device according to the present invention, the first semiconductor material comprises silicon and germanium and the second semiconductor material comprises silicon.

In another aspect, the present invention relates to a semiconductor device, comprising a three-dimensional channel region comprising a core of a first semiconductor material and an epitaxial covering of a second semiconductor material. The first and second semiconductor materials have respectively different lattice constants, thereby to create a strain in the epitaxial covering. A source region is positioned adjacent one end of the three dimensional channel region, and a drain region is positioned adjacent an opposite end of the three dimensional channel region. A gate electrode is superposed on the three dimensional channel region. A hollow three-dimensional gate dielectric layer is positioned between the gate electrode and the three-dimensional channel region.

In preferred embodiments of the semiconductor device according to the present invention, each of the core and the epitaxial covering projects upwardly relative to an underlying substrate.

In preferred embodiments of the semiconductor device according to the present invention, the core is formed integrally with an underlying substrate of the first semiconductor material.

In preferred embodiments of the semiconductor device according to the present invention, the core is formed on an insulating layer of a semiconductor on insulator (SOI) substrate.

In preferred embodiments of the semiconductor device according to the present invention, each of the three-dimensional channel region, the source region, the drain region and the gate electrode are separated from an underlying substrate by the insulating layer, thereby to form a transistor that is full isolated from the underlying substrate.

In preferred embodiments of the semiconductor device according to the present invention, the second semiconductor material has a larger lattice constant than the first semiconductor material, thereby to create a compressive strain in the epitaxial covering.

In preferred embodiments of the semiconductor device according to the present invention, the first semiconductor material comprises silicon and the second semiconductor material comprises silicon and germanium.

In preferred embodiments of the semiconductor device according to the present invention, the second semiconductor material has a smaller lattice constant than the first semiconductor material, thereby to create a tensile strain in the epitaxial covering.

In preferred embodiments of the semiconductor device according to the present invention, the first semiconductor material comprises silicon and germanium and the second semiconductor material comprises silicon.

In preferred embodiments of the semiconductor device according to the present invention, the hollow three-dimensional gate dielectric layer extends upwardly from the three-dimensional channel, region, between the gate electrode and each of a pair of sidewall spacers.

In preferred embodiments of the semiconductor device according to the present invention, the three-dimensional channel region is repeated as a series of the channel regions, and wherein the gate electrode overlies plural channel regions within the series.

In preferred embodiments of the semiconductor device according to the present invention, the hollow three-dimensional gate dielectric layer extends downwardly between adjacent channel regions within the series.

In yet another aspect, the present invention relates to a method of making a semiconductor device, comprising removing a dummy gate from an intermediate transistor structure comprising a three-dimensional channel region of a first semiconductor material underlying the dummy gate, forming an epitaxial covering of a second semiconductor material on a portion of the three-dimensional channel region exposed by removal of the dummy gate, and forming a gate structure contacting the covering of the second semiconductor material.

In preferred embodiments of the method according to the present invention, the three-dimensional channel region projects upwardly relative to an underlying substrate.

In preferred embodiments of the method according to the present invention, the three-dimensional channel region is formed integrally with an underlying substrate of the first semiconductor material.

In preferred embodiments of the method according to the present invention, the three-dimensional channel region is formed on an insulating layer of a semiconductor on insulator (SOI) substrate.

In preferred embodiments of the method according to the present invention, the method additionally includes forming the three-dimensional channel region on a sacrificial layer of a semiconductor material that can be etched under conditions that do not substantially etch the first semiconductor material, forming the dummy gate on the three-dimensional channel region, removing the sacrificial layer to create a void underlying the three-dimensional channel region, and filling the void with a dielectric material prior to removal of the dummy gate.

In preferred embodiments of the method according to the present invention, each of the three-dimensional channel region, a source region, a drain region and the gate electrode are separated from an underlying substrate by the insulating layer, thereby to form a transistor that is full isolated from the underlying substrate.

In preferred embodiments of the method according to the present invention, the second semiconductor material has a larger lattice constant than the first semiconductor material, thereby to create a compressive strain in the epitaxial covering.

In preferred embodiments of the method according to the present invention, the first semiconductor material comprises silicon and the second semiconductor material comprises silicon and germanium.

In preferred embodiments of the method according to the present invention, the second semiconductor material has a smaller lattice constant than the first semiconductor material, thereby to create a tensile strain in the epitaxial covering.

In preferred embodiments of the method according to the present invention, the first semiconductor material comprises silicon and germanium and wherein the second semiconductor material comprises silicon.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 7 is a plan view of an intermediate structure in a manufacturing process of making the device of FIGS. 1, 2a and 3a;

FIG. 11 is a plan view of the intermediate structure in a succeeding state of a manufacturing process of making the device of FIGS. 1, 2a and 3a;

FIG. 14 is a plan view of the intermediate structure in a succeeding state of a manufacturing process of making the device of FIGS. 1, 2a and 3a;

FIG. 17 is a plan view of the intermediate structure in a succeeding state of a manufacturing process of making the device of FIGS. 1, 2a and 3a;

FIG. 20 is a plan view of the intermediate structure in a succeeding state of a manufacturing process of making the device of FIGS. 1, 2a and 3a;

FIG. 23 is a plan view of the intermediate structure in a succeeding state of a manufacturing process of making the device of FIGS. 1, 2a and 3a;

FIG. 62 schematically depicts operational advantages arising from the use of semiconductor devices according to embodiments of the present invention;

FIG. 63 schematically depicts a corresponding lack of operational advantages arising from the use of conventional semiconductor devices;

FIG. 64 schematically depicts an energy band profile of semiconductor devices according to embodiments of the present invention;

FIG. 65 schematically depicts usage phenomena associated with the embodiment of FIGS. 1, 2a and 3a.

DETAILED DESCRIPTION

Figure 1:
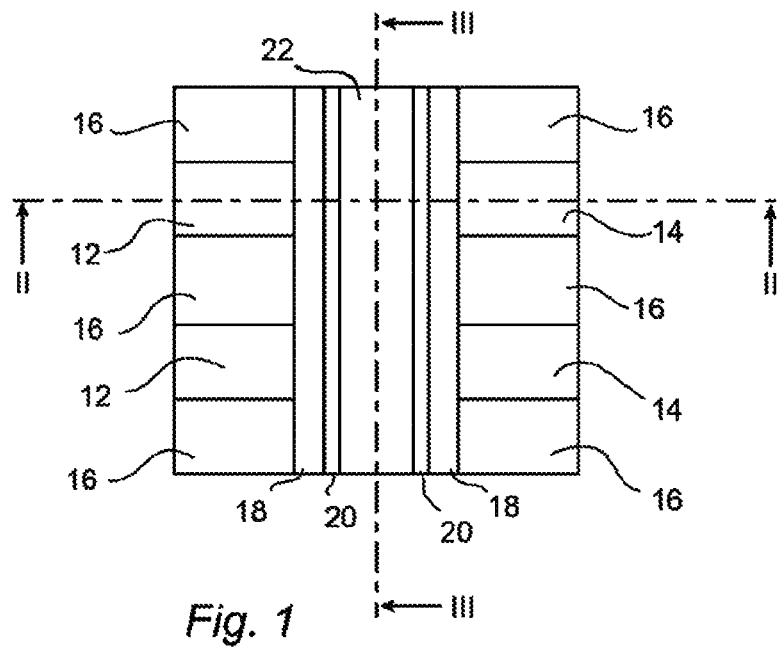
FIG. 1 is a plan view of a FinFET according to a first embodiment of the methods and devices according to the present invention.
Figure 2A:
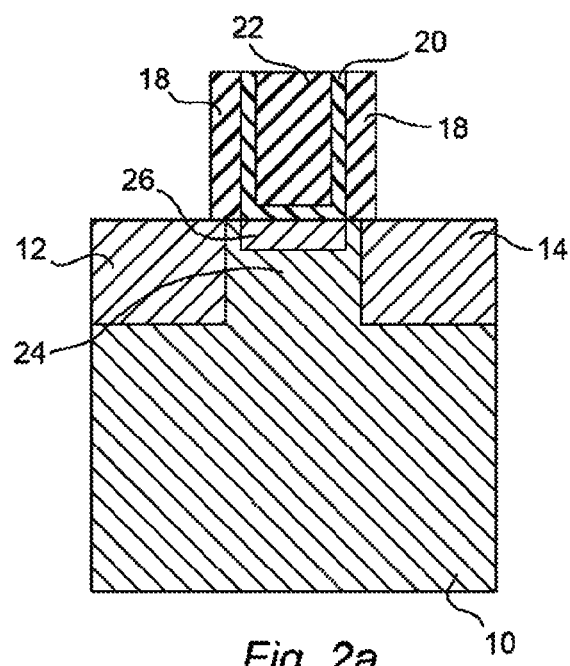
FIG. 2a is a cross-sectional view along the line II-II of FIG. 1.
Figure 3A:
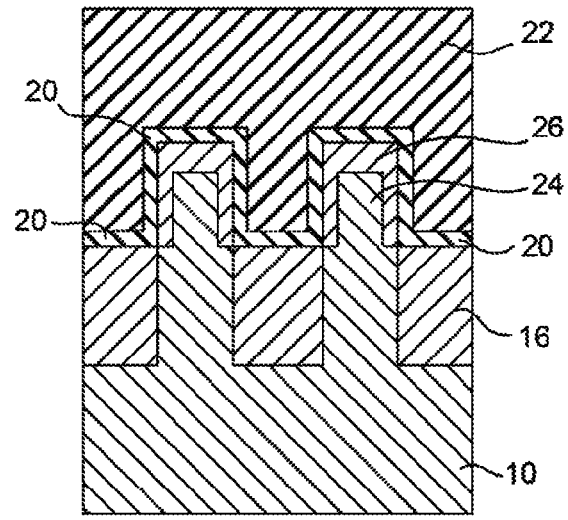
FIG. 3a is a cross-sectional view along the line III-III of FIG. 1.

In FIGS. 1, 2a and 3a, a first embodiment of the present invention is a FinFET in which a series of silicon fins 24 has been formed integrally with an underlying bulk silicon substrate 10. A gate 22 extends across plural transistors as shown in FIG. 1, and is clad with a gate dielectric film 20. Source and drain regions of each transistor are designated 12 and 14, respectively.

A gate dielectric film 20 is positioned between the gate 22 and sidewall spacers 18, as shown in FIG. 2, and is also positioned between the gate electrode 22 and channel regions 26 as well as dielectric 16, as shown in FIGS. 2 and 3. The gate dielectric film 20 thus has a hollow, three-dimensional structure.

The upper part of Si fin 24 is clad with a layer of epitaxial silicon-germanium 26, as is best seen in FIGS. 2 and 3. As SiGe has a larger lattice constant than Si, the channel regions of the illustrated FinFET will be compressively strained. Although compressive strain is preferred for the devices according to the present invention, it is also within the scope of the invention to provide materials for the core and cladding of the fin such that the cladding material has a smaller lattice constant than the core, which results in a tensile strain for the channel regions.

The SiGe epitaxial layer is confined to the region beneath the gate electrode 22, by which is meant the region including the gate electrode 22 itself, as well as the surrounding gate dielectric film 20.

Figure 2B:
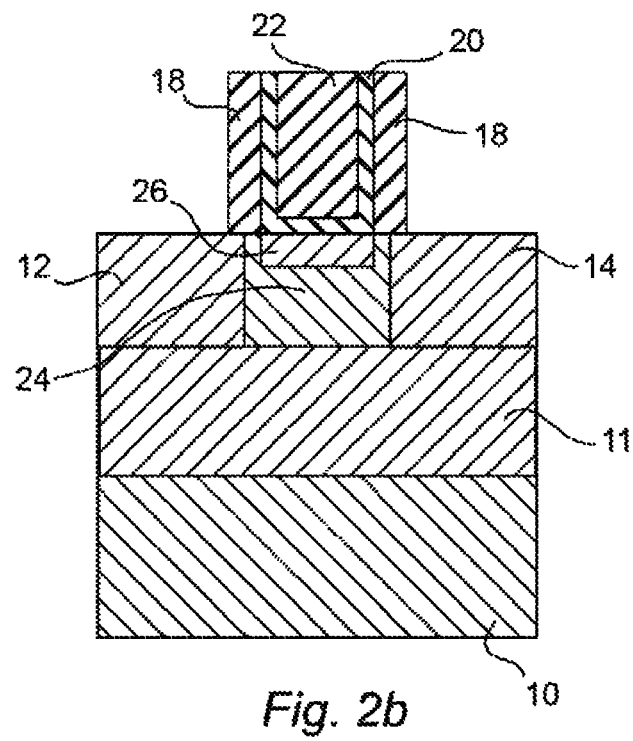
FIG. 2b is a cross-sectional view like that of FIG. 2a, showing the corresponding structure for an SOI substrate.
Figure 3B:
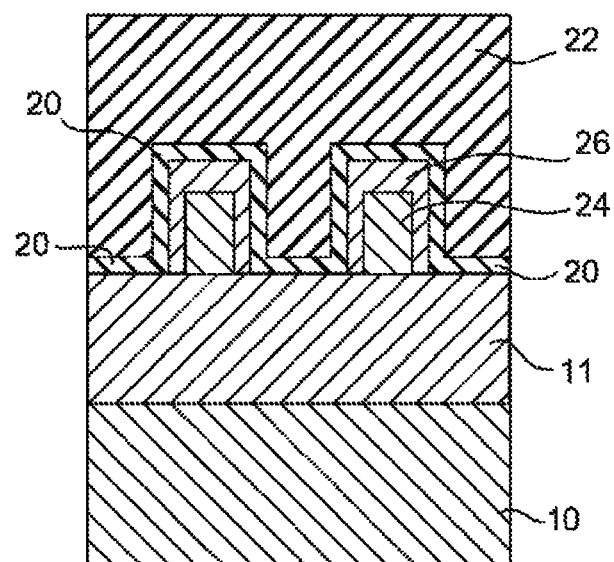
FIG. 3b is a cross-sectional view like that of FIG. 3a, showing the corresponding structure for an SOI substrate.

In FIGS. 2b and 3b, a structure like that of the preceding figures is shown, however, the bulk substrate has been replaced by a silicon-on-insulator or SOI substrate, including insulating layer 11.

Figure 4:
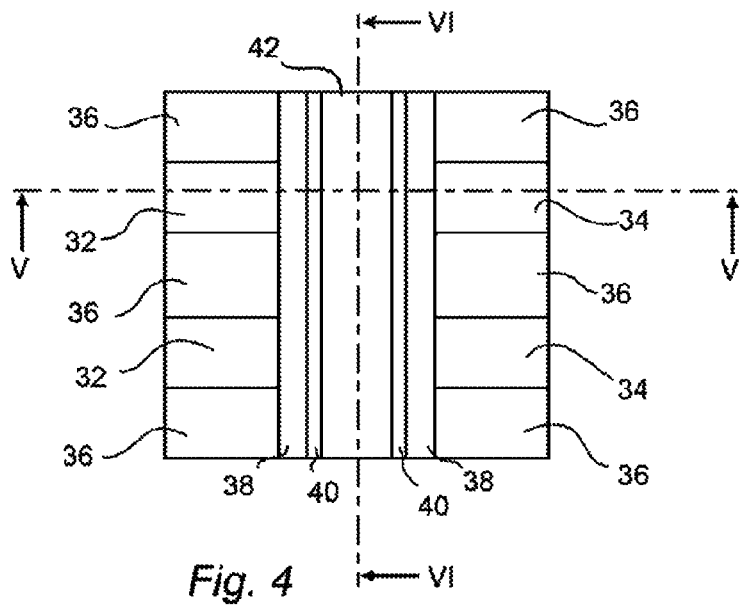
FIG. 4 is a plan view of a FinFET according to a further embodiment of the methods and devices according to the present invention.
Figure 5:
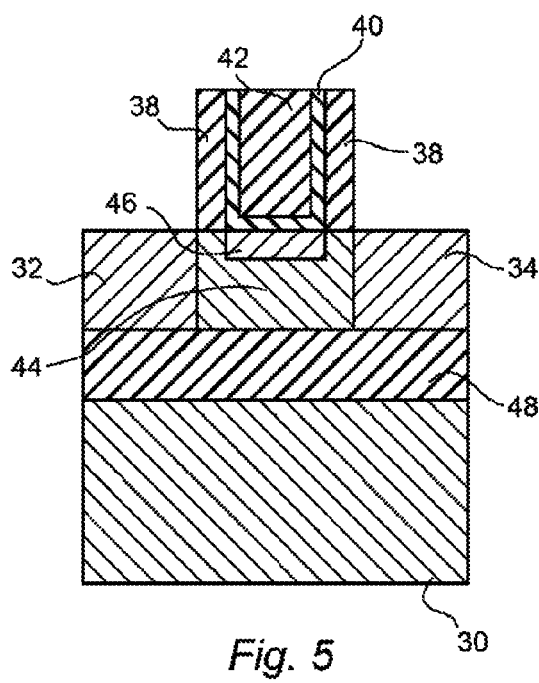
FIG. 5 is a cross-sectional view along the line V-V of FIG. 4.
Figure 6:
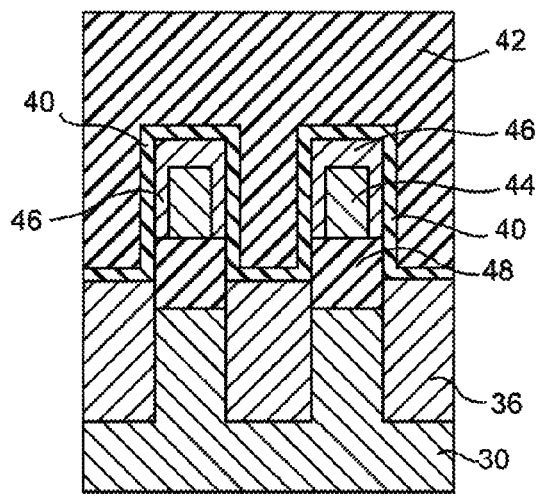
FIG. 6 is a cross-sectional view along the line VI-VI of FIG. 4.
Figure 7:
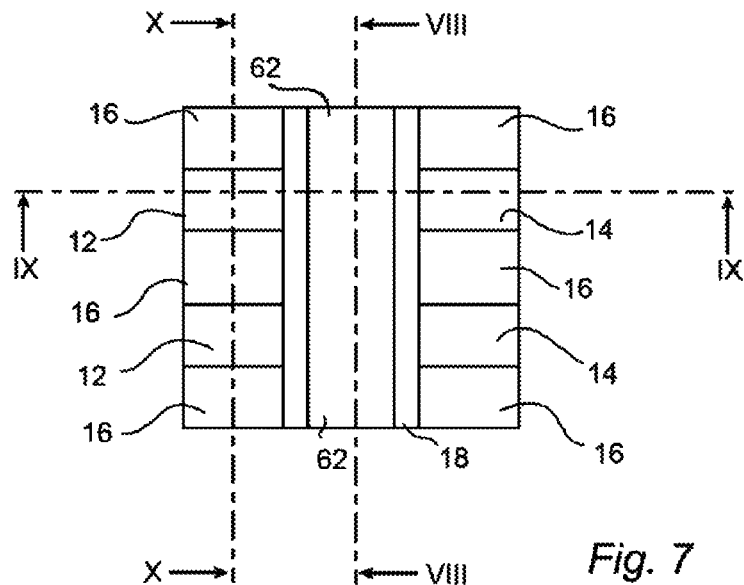
Figures 8, 9:
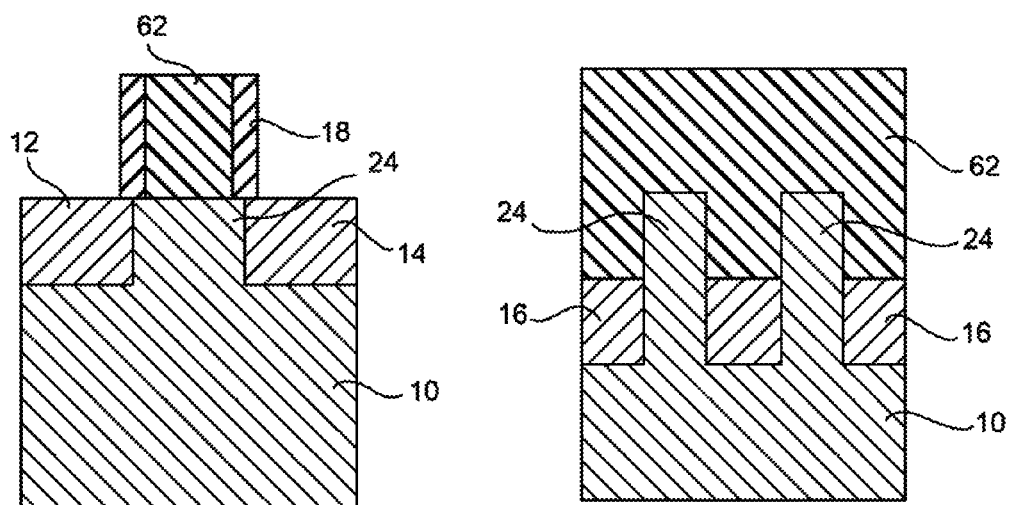
FIG. 8 is a cross-sectional view along the line VIII-VIII of FIG. 7.
FIG. 9 is a cross-sectional view along the line IX-IX of FIG. 7.
Figure 10:
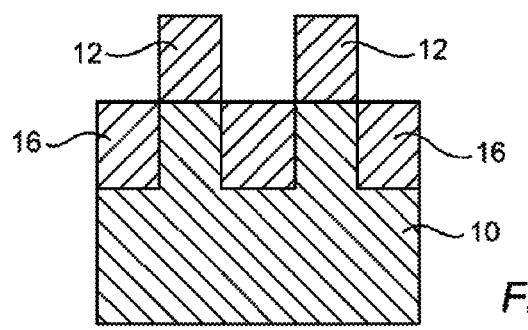
FIG. 10 is a cross-sectional view along the line X-X of FIG. 7.

In FIGS. 4-6, a further embodiment of the present invention is a FinFET in which a series of silicon fins 44 are separated from an underlying bulk silicon substrate 30 by layer 48 of refilled dielectric. The device of this embodiment is of the silicon-on-nothing or SON type, as will be described hereinafter. A gate 42 extends across plural transistors as shown in FIG. 4, and is clad with a gate dielectric film 40. Source and drain regions of each transistor are designated 32 and 34, respectively.

The gate dielectric film 40 is positioned between the gate 42 and sidewall spacers 38, as shown in FIG. 5, and is also positioned between the gate electrode 42 and channel regions 46 as well as dielectric 36, as shown in FIGS. 5 and 6. The gate dielectric film 40 thus has a hollow, three-dimensional structure.

The Si fins 44 are clad with a layer of epitaxial silicon-germanium 46, as is best seen in FIGS. 5 and 6. Again, as SiGe has a larger lattice constant than Si, the channel regions of the illustrated FinFET will be compressively strained. However, it is also again within the scope of the invention to provide materials for the core and cladding of the fin such that the cladding material has a smaller lattice constant than the core, which results in a tensile strain for the channel regions.

The SiGe epitaxial layer 46 is again confined to the region beneath the gate electrode 42, by which is meant the region including the gate electrode 42 itself, as well as the surrounding gate dielectric film 40.

In both of the above embodiments, the compressive strain is desirable as it promotes hole mobility in the channel region, as is known. However, in conventional devices utilizing strained channels for increased hole mobility, the lattice strain is substantially relaxed by the high temperature processing that occurs after the strain is created. The devices and methods of the present invention avoid that disadvantage, as will be better understood from the following explanation of preferred manufacturing techniques for the embodiments described above.

As shown in FIGS. 7-10, a device as described above in connection with FIGS. 1, 2a and 3a is advantageously made by a gate-last process, in which a dummy FinFET is made with fins 24 that are initially of Si only, and with a dummy gate 62 in place of the as yet unformed actual, gate. The dummy gate 62 may for example be polysilicon, and the sidewall spacers 18 may for example be silicon nitride, although other materials may be selected according to the knowledge of those skilled in the art.

The process stage shown in FIGS. 7-10 will typically also include formation of an interlayer dielectric to cover the source and drain regions, followed by palanarization of the same, although this is not shown in the figures for ease of understanding.

Although this discussion focuses on the manufacture of a device according to FIGS. 1, 2a and 3a, it will be appreciated that the corresponding device formed on an SOI substrate as shown in FIGS. 2b and 3b would be made in the same way, with the exception that the bulk silicon substrate is replaced by an SOI substrate.

Figure 11:
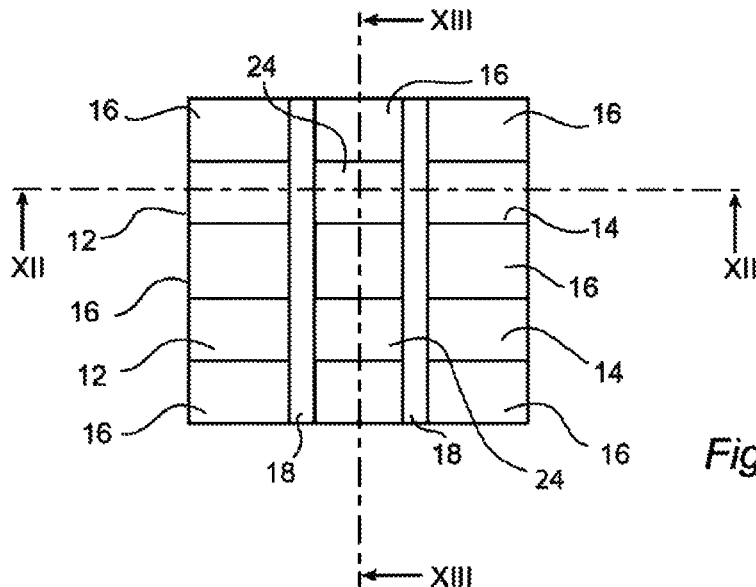
Figure 12:
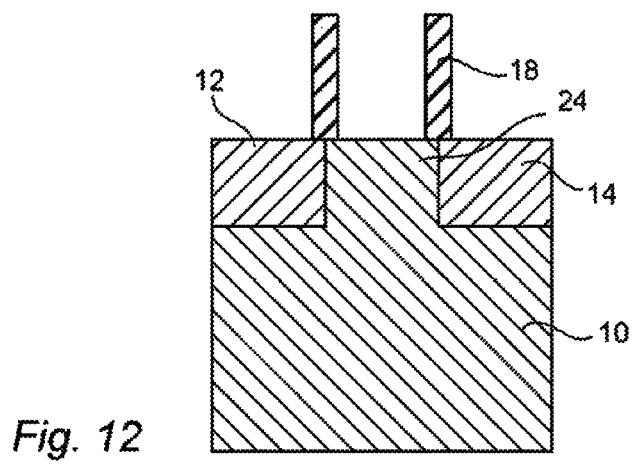
FIG. 12 is a cross-sectional view along the line XII-XII of FIG. 11.
Figure 13:
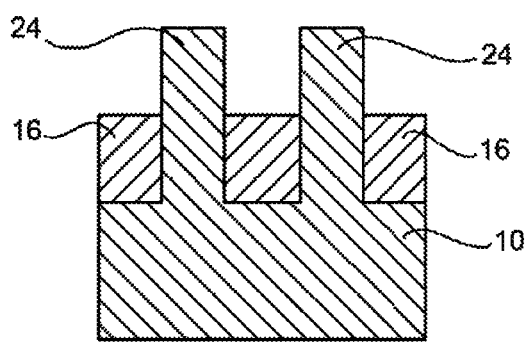
FIG. 13 is a cross-sectional view along the line XIII-XIII of FIG. 11.

Next, as shown in FIGS. 11-13, the dummy gate 62 is removed by a conventional technique such as wet etching, which thereby exposes the silicon fins 24 between sidewall spacers 18. As can be seen in FIG. 13, successive fins 24 are separated from one another by dielectric layer 16, which layer 16 however does not extend upwardly the full height of fins 24.

Figure 14:
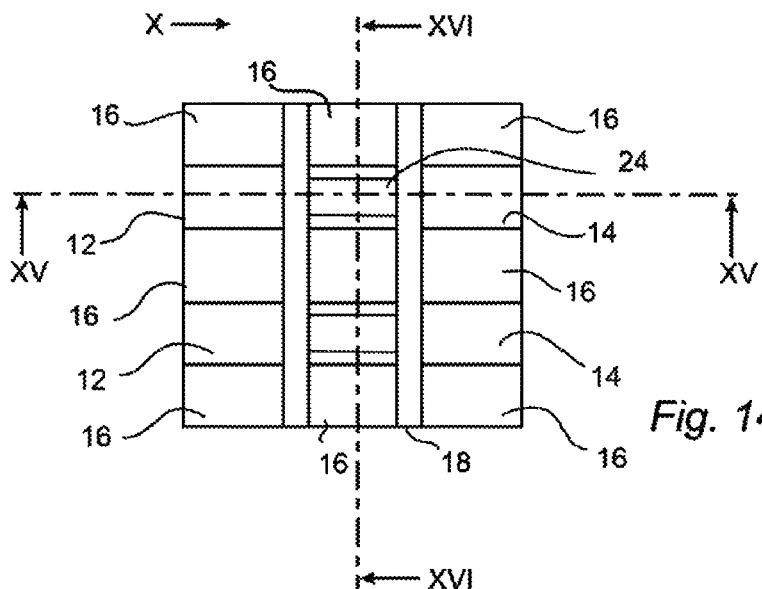
Figure 15:
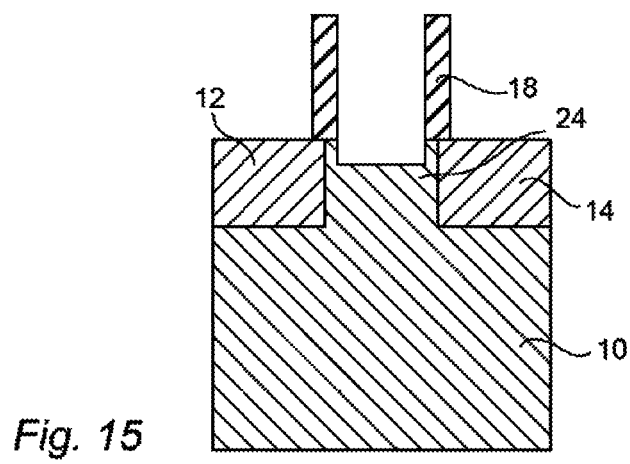
FIG. 15 is a cross-sectional view along the line XV-XV of FIG. 14.
Figure 16:
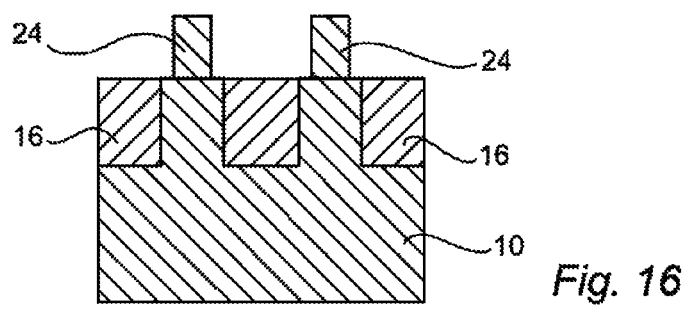
FIG. 16 is a cross-sectional view along the line XVI-XVI of FIG. 14.

The structure illustrated in FIGS. 11-13 is then subjected to further etching, for example by RIE, to recess the fins 24 somewhat. Thus, as shown in FIGS. 14 and 16, the fins 24 become narrower in the horizontal direction perpendicular to the source-drain direction, and also become shorter, as shown in FIG. 15. Although this recessing of the fins is preferred, it is not essential and may be omitted. It is also noted that this recessing may additional remove part of the fin structure underlying the sidewalls 18.

Figure 17:
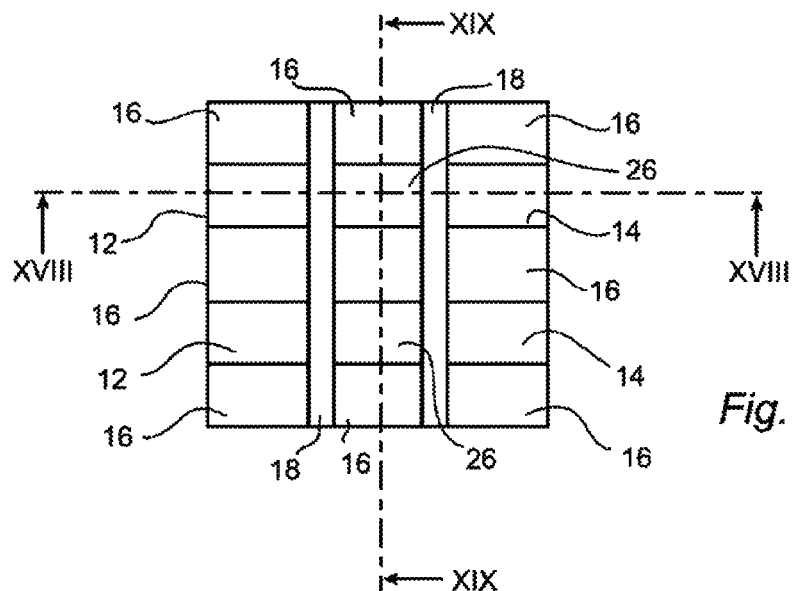
Figure 18:
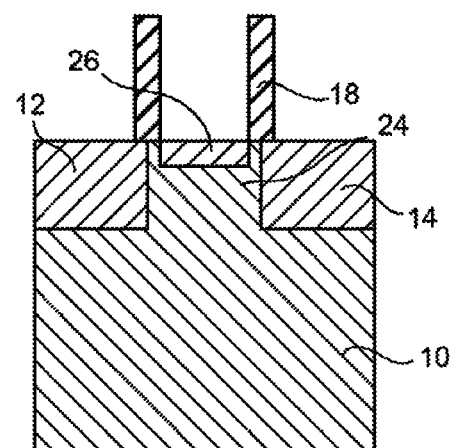
FIG. 18 is a cross-sectional view along the line XVIII-XVIII of FIG. 17.
Figure 19:
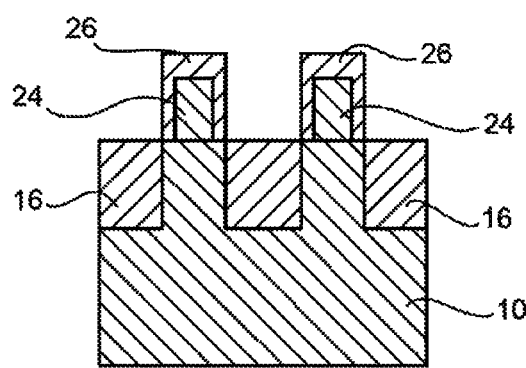
FIG. 19 is a cross-sectional view along the line XIX-XIX of FIG. 17.

Then, as shown in FIGS. 17-19, an epitaxial layer of silicon-germanium 26 is formed on the fins 24. Because the sidewalls 18 previously formed by the gate-last process act as a mask, the SiGe film 26 is formed only in the regions that will eventually be covered by the gate dielectric layer and the gate itself. Additionally, if the fins 24 have been recessed as described in connection with FIGS. 14-16, then the SiGe film 26 may also extend slightly underneath the sidewalls 18. In forming the SiGe film 26, the formation conditions are preferably selected so that the film will have a Ge content of at least 20%.

Figure 20:
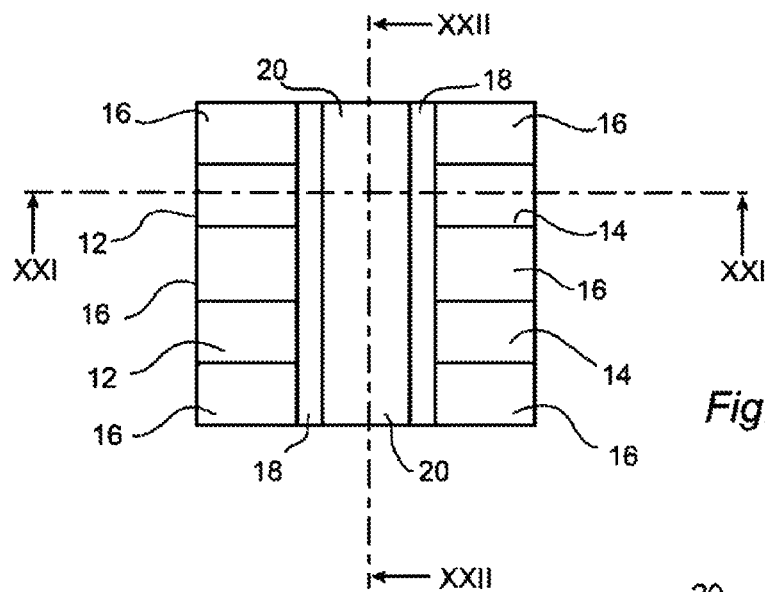
Figure 21:
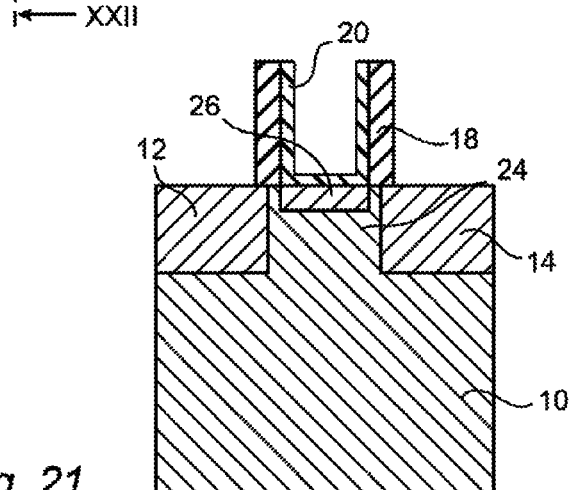
FIG. 21 is a cross-sectional view along the line XXI-XXI of FIG. 20.
Figure 22:
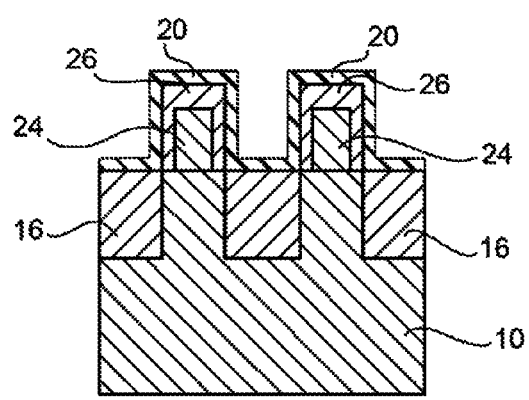
FIG. 22 is a cross-sectional view along the line XXII-XXII of FIG. 20.

Next, as shown in FIGS. 20-22, the gate dielectric layer 20 is formed so as to line the volume that will be filled by the gate. The sidewalls 18 again serve as a mask for deposition of the gate dielectric layer 20, which is preferably a high-k material. As can be seen in FIGS. 20-22, the gate dielectric layer 20 extends upwardly from the fins 24 along the sidewalls 18 (FIG. 21), and extends downwardly between adjacent fins (FIG. 22). The gate dielectric layer 20 therefore has a hollow, three-dimensional shape as a result of the gate-last process used.

Figure 23:
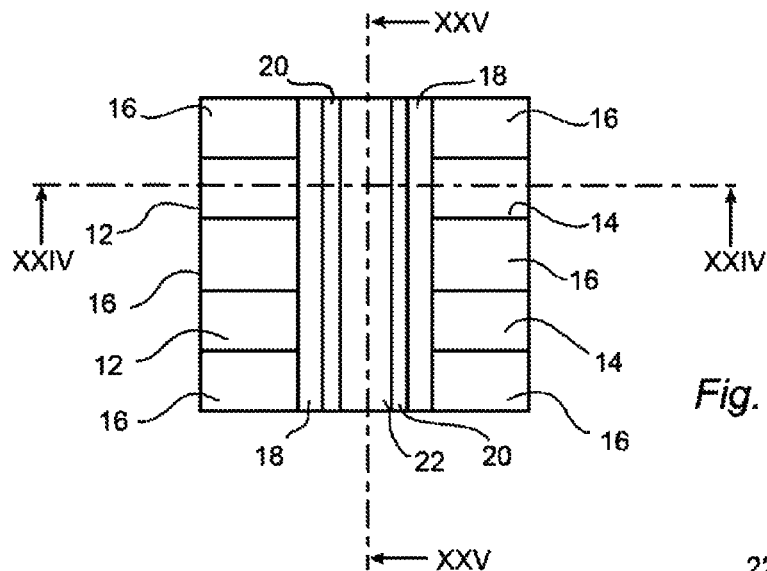
Figure 24:
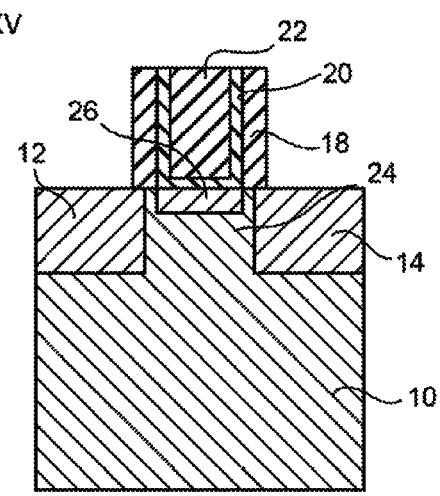
FIG. 24 is a cross-sectional view along the line XXIV-XXIV of FIG. 23.
Figure 25:
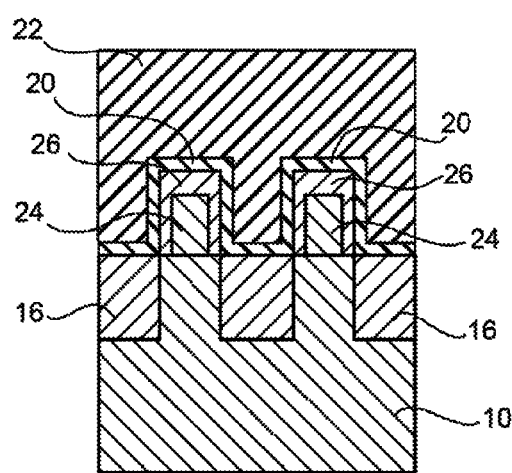
FIG. 25 is a cross-sectional view along the line XXV-XXV of FIG. 23.

The gate 22 is then formed, as shown in FIGS. 23-25.

As discussed above, SiGe intrinsically has larger lattice constant than Si; however, for an epitaxial layer of SiGe, the crystal lattice follows that of the template Si. Therefore, this SiGe layer 26 on Si fin 24 is compressively strained. The hole mobility in a compressively-strained SiGe channel is known to be higher than that in neutral Si. However, in conventional devices, the strain in an SiGe channel is relaxed during high-temperature processes, such that the hole mobility benefit is greatly reduced or lost altogether.

By contrast, in the devices and methods as described above, the high temperature processes (such as isolation dielectric densify anneal and source/drain activation anneal) are done prior to formation of the SiGe epitaxial layer, and thus the favorable compressive strain in the SiGe channel is preserved.

Figure 26:
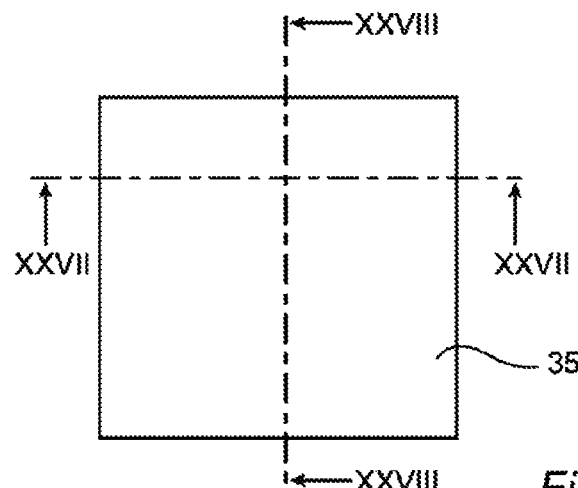
FIG. 26 is a plan view of an intermediate structure in a manufacturing process of making the device of FIGS. 4-6.
Figure 27:
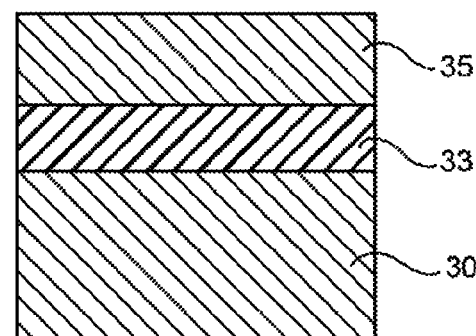
FIG. 27 is a cross-sectional view along the line XXVII-XXVII of FIG. 26.
Figure 28:
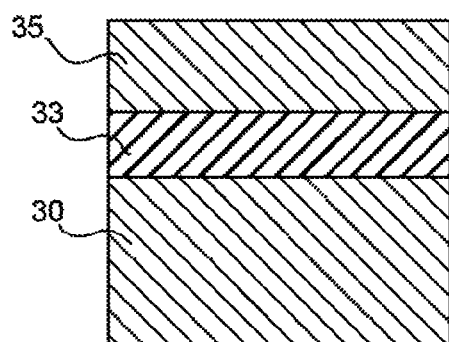
FIG. 28 is a cross-sectional view along the line XXVIII-XXVIII of FIG. 26.

The methods for making devices as described above in connection with FIGS. 4-6 proceeds from a substrate as shown in FIGS. 26-28, including a bulk silicon substrate 30 that is separated from an upper thin silicon layer 35 by a sacrificial layer 33 of SiGe that will be removed during subsequent processing.

Figure 29:
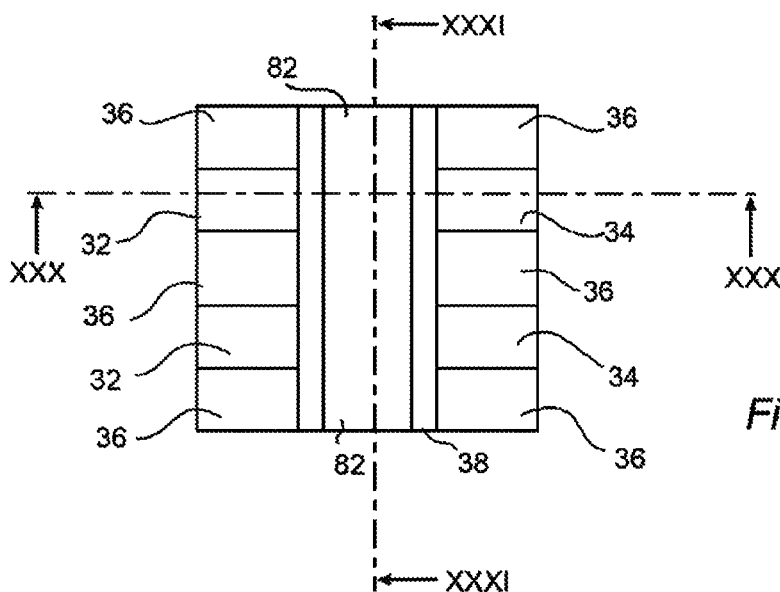
FIG. 29 is a plan view of the intermediate structure in a succeeding state of a manufacturing process of making the device of FIGS. 4-6.
Figure 30:
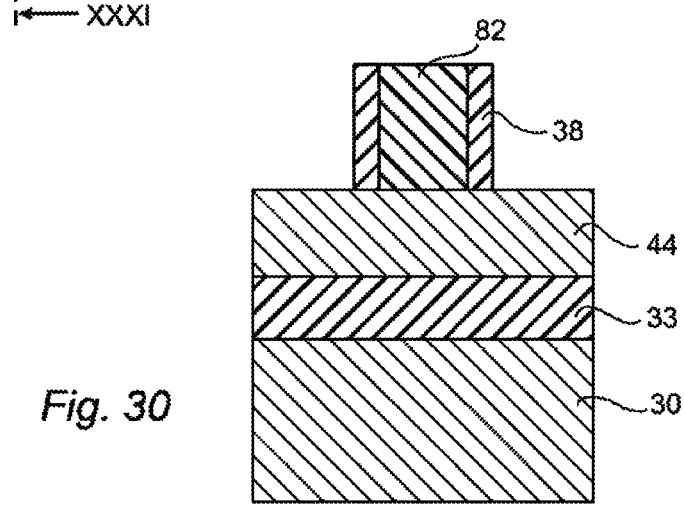
FIG. 30 is a cross-sectional view along the line XXX-XXX of FIG. 29.
Figure 31:
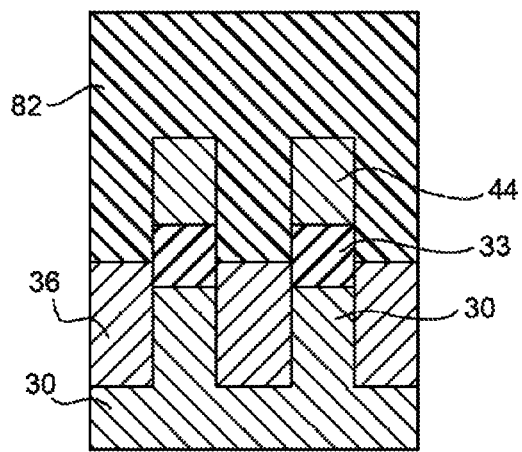
FIG. 31 is a cross-sectional view along the line XXXI-XXXI of FIG. 29.
Figure 32:
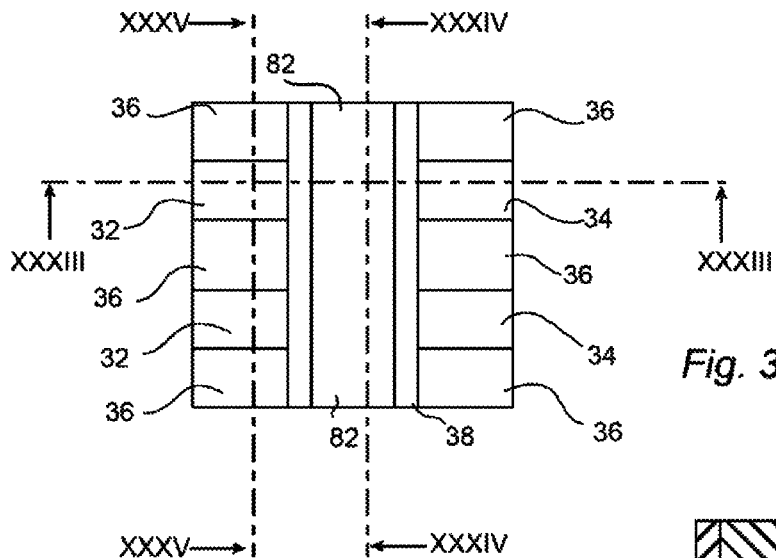
FIG. 32 is a plan view of the intermediate structure in a succeeding state of a manufacturing process of making the device of FIGS. 4-6.

As shown in FIGS. 29-31, a dummy FinFET is formed similarly to that described in the preceding embodiment, with a dummy gate 82 for example of polysilicon being formed between the sidewall spacers 38. In these embodiments, the fin structures 44 are fully isolated from the bulk Si substrate 30 by the sacrificial SiGe layer 33. These fully-isolated fins 44 can be formed by known "silicon-on-nothing" (SON) processes based on elective etching of the sacrificial SiGe layer 33, as described for example Jurczak et. al., "Silicon-on-Nothing (SON)—an Innovative Process for Advanced CMOS", *IEEE Trans. Elec. Dev.*, vol. 47, no. 11 (November 2000).

Figure 33:
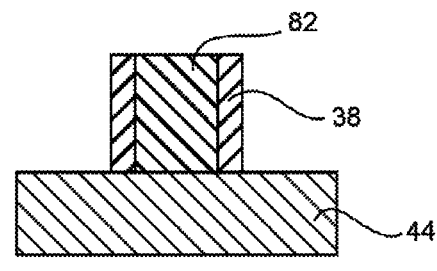
FIG. 33 is a cross-sectional view along the line XXXIII-XXXIII of FIG. 32.
Figure 34:
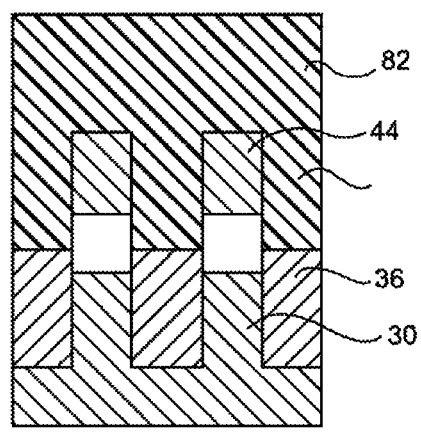
FIG. 34 is a cross-sectional view along the line XXXIV-XXXIV of FIG. 32.
Figure 35:
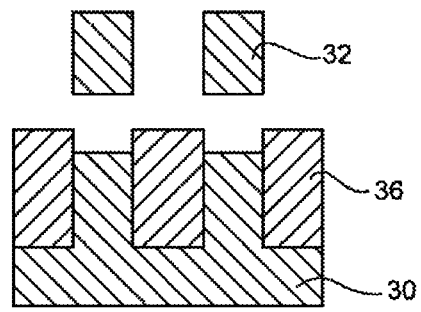
FIG. 35 is a cross-sectional view along the line XXXV-XXXV of FIG. 32.
Figure 36:
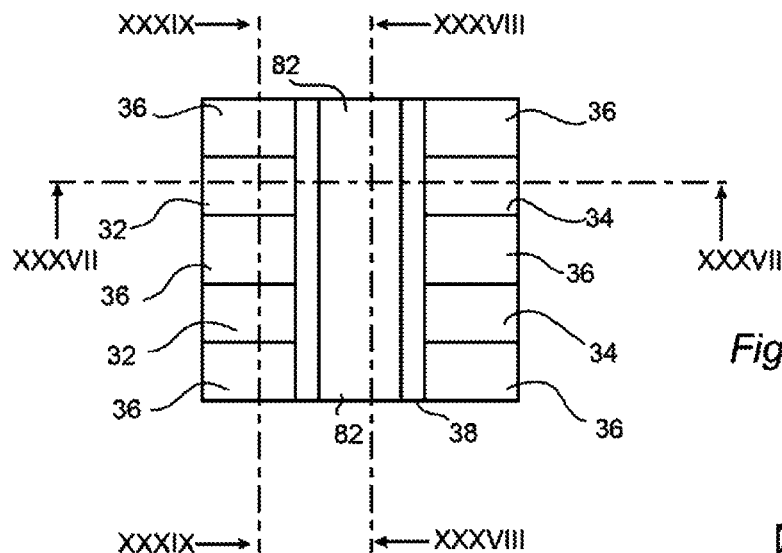
FIG. 36 is a plan view of the intermediate structure in a succeeding state of a manufacturing process of making the device of FIGS. 4-6.
Figure 37:
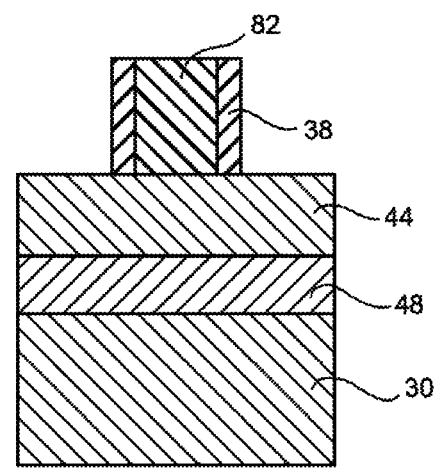
FIG. 37 is a cross-sectional view along the line XXXVII-XXXVII of FIG. 36.
Figure 38:
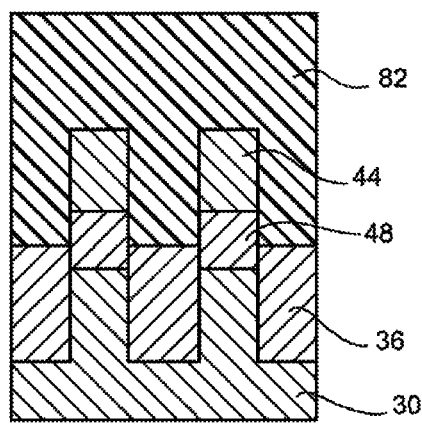
FIG. 38 is a cross-sectional view along the line XXXVIII-XXXVIII of FIG. 36.
Figure 39:
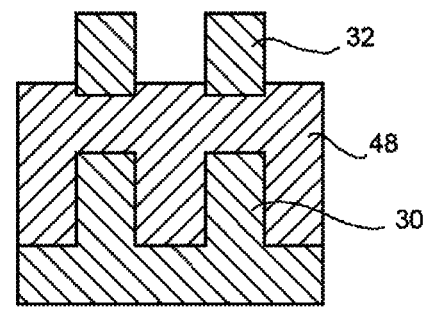
FIG. 39 is a cross-sectional view along the line XXXIX-XXXIX of FIG. 36.
Figure 40:
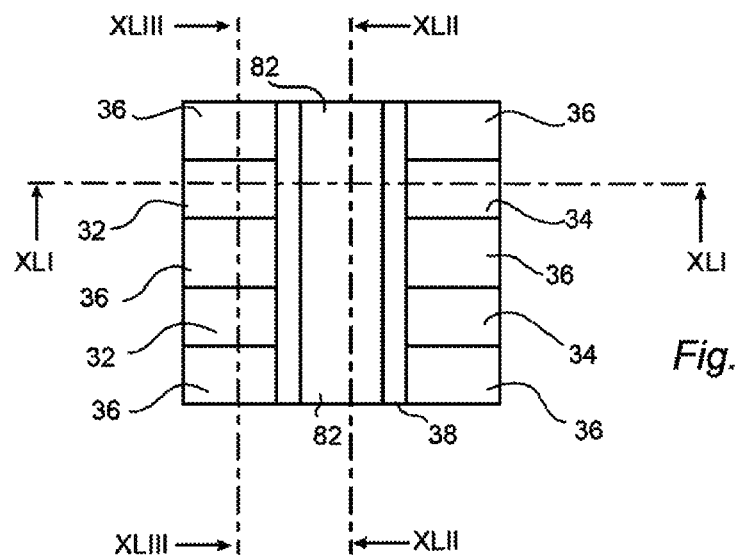
FIG. 40 is a plan view of the intermediate structure in a succeeding state of a manufacturing process of making the device of FIGS. 4-6.
Figure 41:
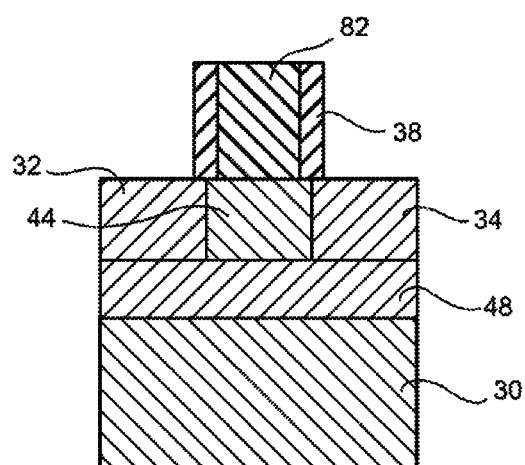
FIG. 41 is a cross-sectional view along the line XLI-XLI of FIG. 40.
Figure 42:
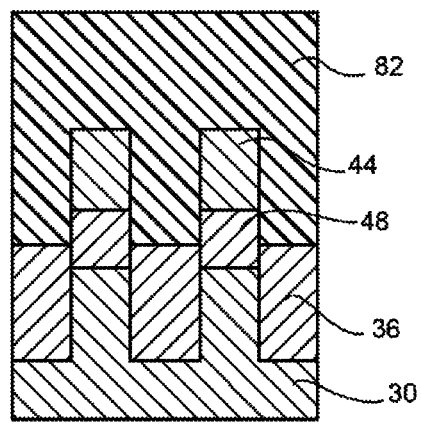
FIG. 42 is a cross-sectional view along the line XLII-XLII of FIG. 40.
Figure 43:
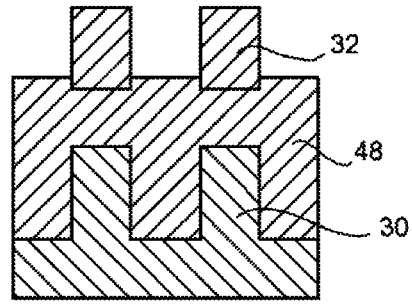
FIG. 43 is a cross-sectional view along the line XLIII-XLIII of FIG. 40.
Figure 44:
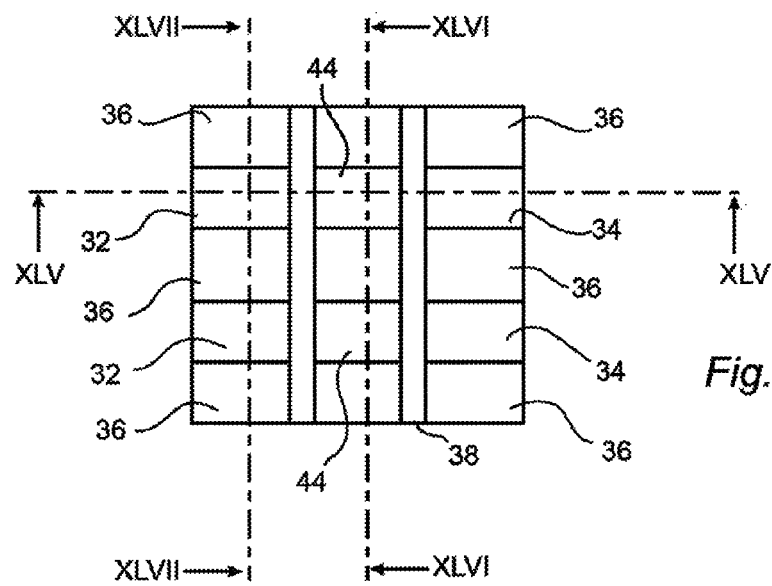
FIG. 44 is a plan view of the intermediate structure in a succeeding state of a manufacturing process of making the device of FIGS. 4-6.
Figure 45:
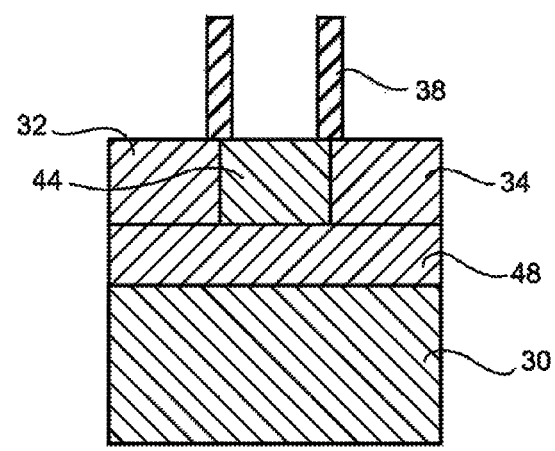
FIG. 45 is a cross-sectional view along the line XLV-XLV of FIG. 44.
Figure 46:
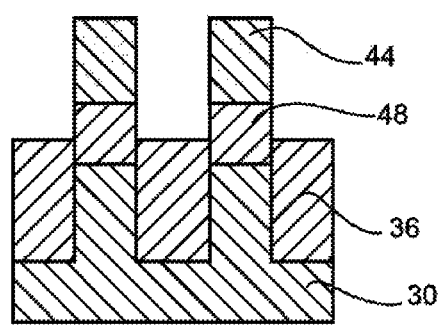
FIG. 46 is a cross-sectional view along the line XLVI-XLVI of FIG. 44.
Figure 47:
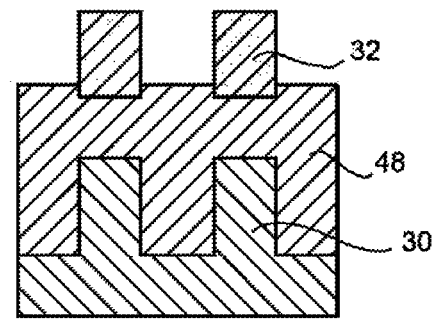
FIG. 47 is a cross-sectional view along the line XLVII-XLVII of FIG. 44.
Figure 48:
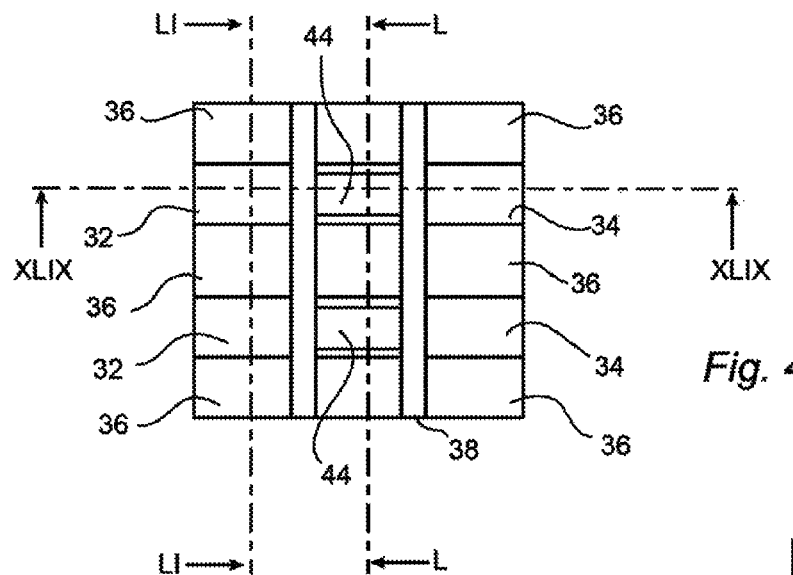
FIG. 48 is a plan view of the intermediate structure in a succeeding state of a manufacturing process of making the device of FIGS. 4-6.
Figure 49:
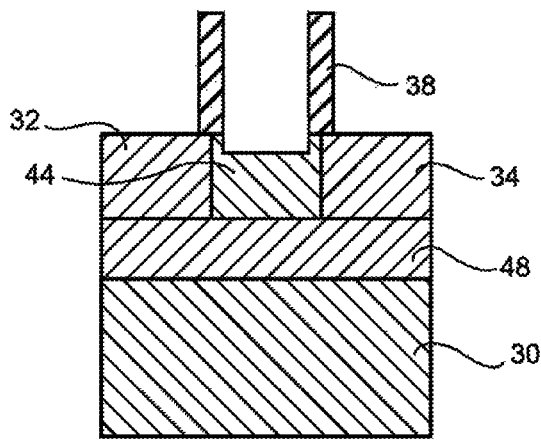
FIG. 49 is a cross-sectional view along the line XLIX-XLIX of FIG. 48.
Figure 50:
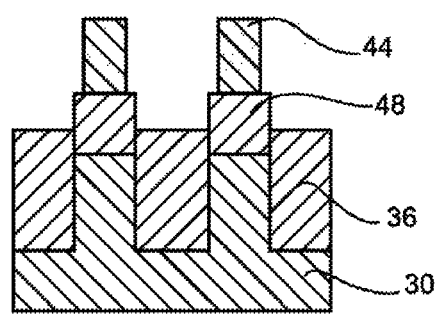
FIG. 50 is a cross-sectional view along the line L-L of FIG. 48.
Figure 51:
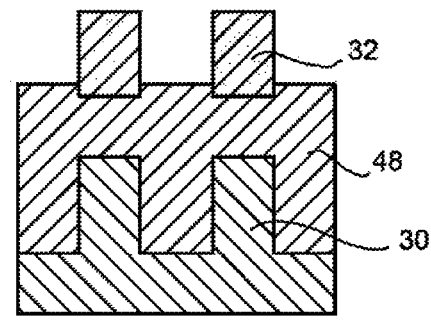
FIG. 51 is a cross-sectional view along the line LI-LI of FIG. 48.
Figure 52:
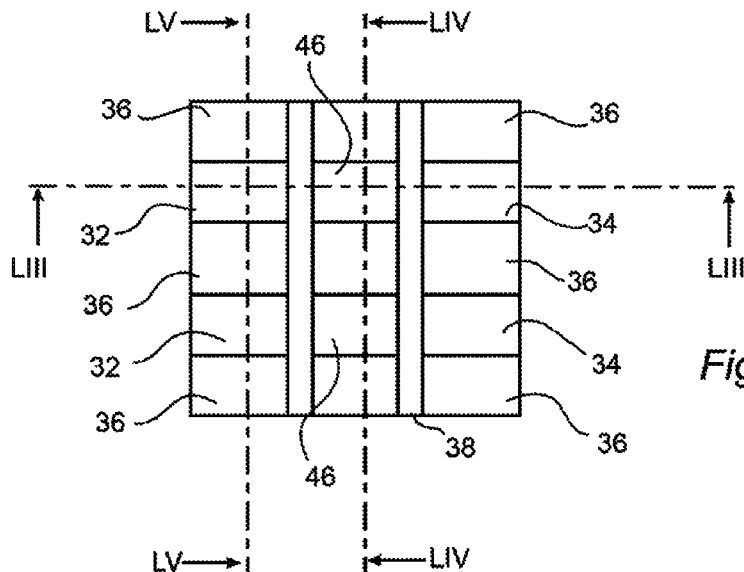
FIG. 52 is a plan view of the intermediate structure in a succeeding state of a manufacturing process of making the device of FIGS. 4-6.
Figure 53:
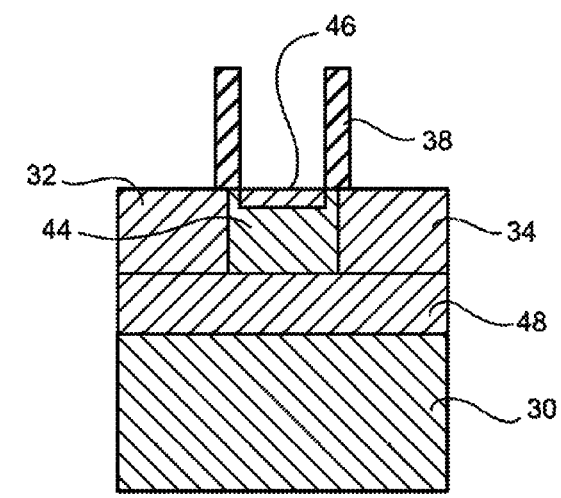
FIG. 53 is a cross-sectional view along the line XLIX-XLIX of FIG. 52.
Figure 54:
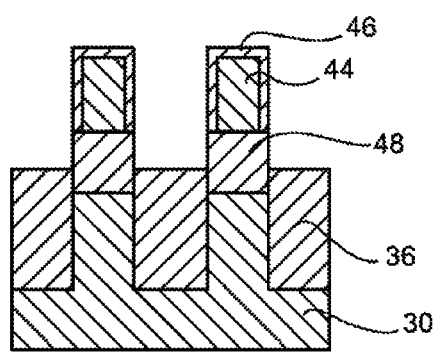
FIG. 54 is a cross-sectional view along the line L-L of FIG. 52.
Figure 55:
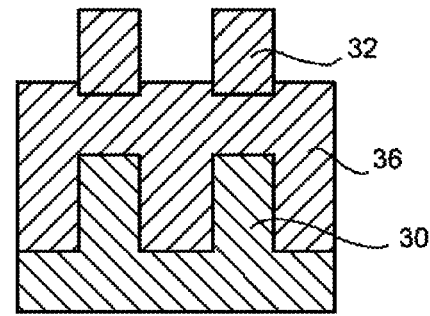
FIG. 55 is a cross-sectional view along the line LI-LI of FIG. 52.

In particular, the SiGe layer 33 and Si layer 35 are sequentially grown on the bulk-Si substrate 30 to produce the structure shown in FIGS. 26-28, followed by formation of the Si/SiGe/Si stacked fin structures 30, 33, 44 as shown in FIGS. 29-31. After formation of the dummy gate 82, the sacrificial SiGe layer 33 is removed by selective etching (for example HCl gas etching), to produce a structure as shown in FIGS. 32-35. Although the fins 44 at this stage lack subjacent support they are nevertheless supported from above by the dummy gate 82 and sidewall spacers 38, as shown in FIGS. 33 and 34. The void underlying fins 44 serves to isolate them fully from the bulk Si substrate 30.

Next, these voids are refilled with dielectric 48, as shown in FIGS. 36-39. Then, after formation of source and drain regions 32, 34 as shown in FIGS. 40-43, dummy gate 82 is removed as shown in FIGS. 44-47, similarly to the process described in connection with the preceding embodiments. FIGS. 48-51 illustrate the optional recessing of the Si fins 44, as also described in connection with the preceding embodiments.

Figure 56:
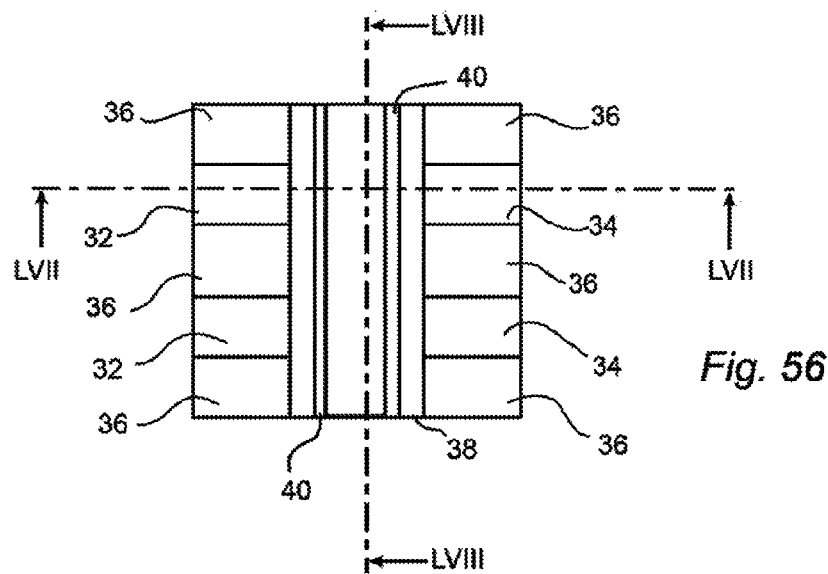
FIG. 56 is a plan view of the intermediate structure in a succeeding state of a manufacturing process of making the device of FIGS. 4-6.
Figure 57:
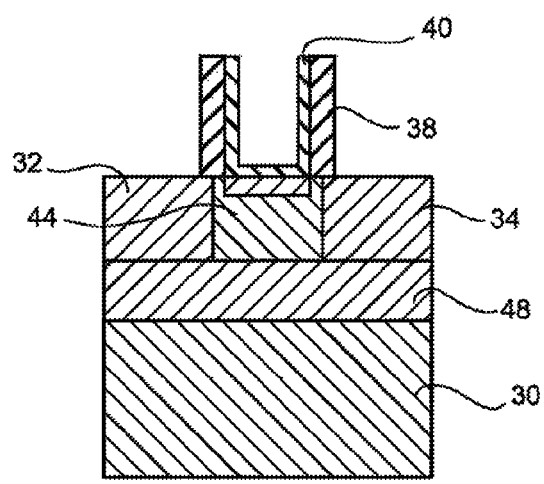
FIG. 57 is a cross-sectional view along the line LVII-LVII of FIG. 56.
Figure 58:
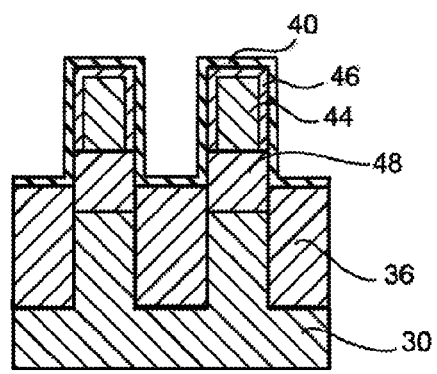
FIG. 58 is a cross-sectional view along the line LVIII-LVIII of FIG. 56.
Figure 59:
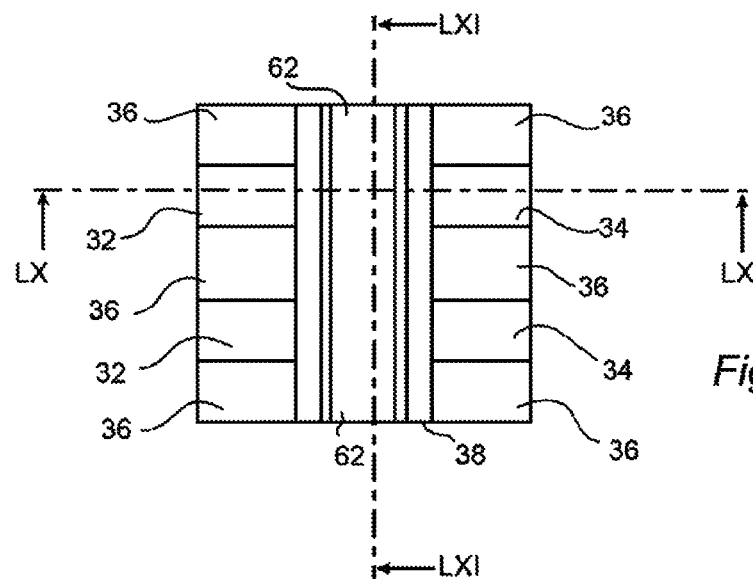
FIG. 59 is a plan view of the intermediate structure in a succeeding state of a manufacturing process of making the device of FIGS. 4-6.
Figure 60:
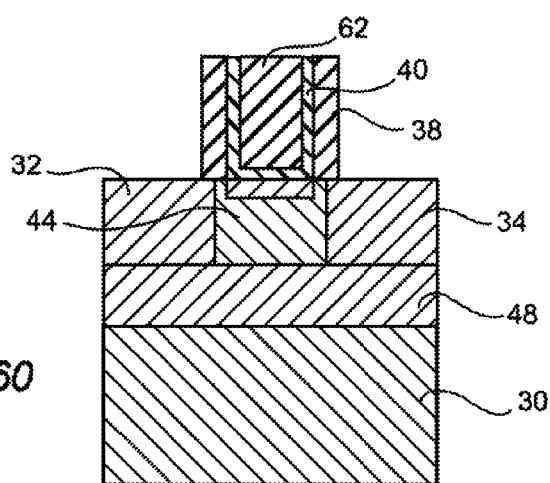
FIG. 60 is a cross-sectional view along the line LX-LX of FIG. 59.
Figure 61:
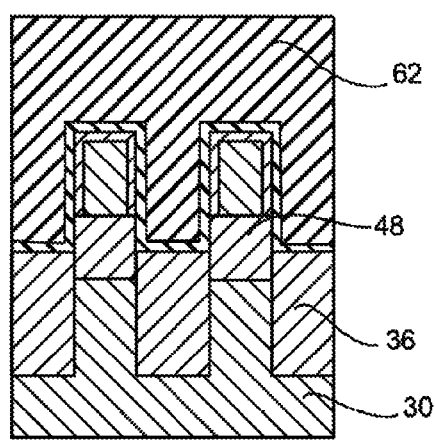
FIG. 61 is a cross-sectional view along the line LXI-LXI of FIG. 59.

The strained SiGe channel 46 is then formed, as illustrated in FIGS. 52-55 and as described in connection with the preceding embodiments. Next, a layer 40 of a preferably high-k material is deposited as a gate dielectric layer, as shown in FIGS. 56-58 and as also described in connection with the preceding embodiments. Lastly, the actual device gate 62 is deposited and planarized, as shown in FIGS. 59-61 and also as described in connection with the preceding embodiments.

By using fin structures in which both sides of a narrow fin body are covered by the gate electrode, the potential profile in the fin body is well controlled by the gate electrode. Consequently, off-state leakage current can be suppressed compared to a planar device. Still further, in devices according to certain preferred embodiments of the present invention, the fin body has a Si core and a SiGe cladding. As illustrated in FIGS. 62-64, there is a valence band energy offset between the Si core 24 and the SiGe cladding 26 (FIG. 64), such that on-state performance is determined by the cladding region while off-state leakage current is determined by the core region. Because of this valence band offset, the hole population in the core region is lower than for a fin made entirely of SiGe (FIGS. 62 and 63), and thus off-state leakage current can be suppressed.

If Ge is diffused into the core region, the compressive strain weakens, and at the same the time band offset between cladding and core gets smaller. This phenomenon results in a loss of off-state leakage suppression. However, in the preferred embodiments of the present invention, the high-temperature processes are performed prior to SiGe channel formation, and thus a relatively abrupt Ge profile is preserved and Ge diffusion into the Si core is minimized.

Figure 65:
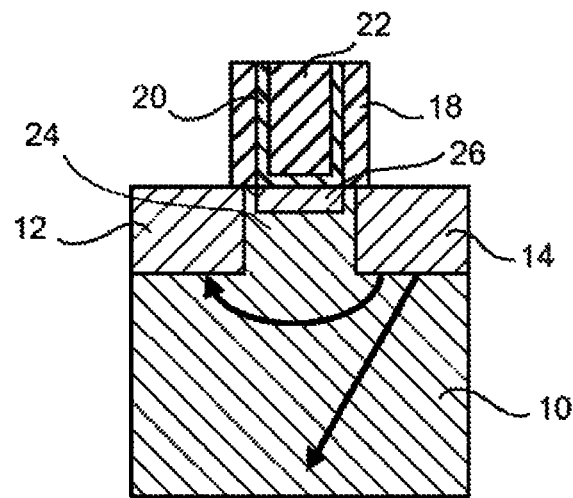

Furthermore, as illustrated in FIG. 65, when the FinFET is formed directly on a bulk Si substrate, there are several off-state leakage current paths, as indicated by the solid arrows in FIG. 65. In particular, there is a source/drain punch-through current below the fin region and also a drain/substrate junction leakage current.

Figure 66:
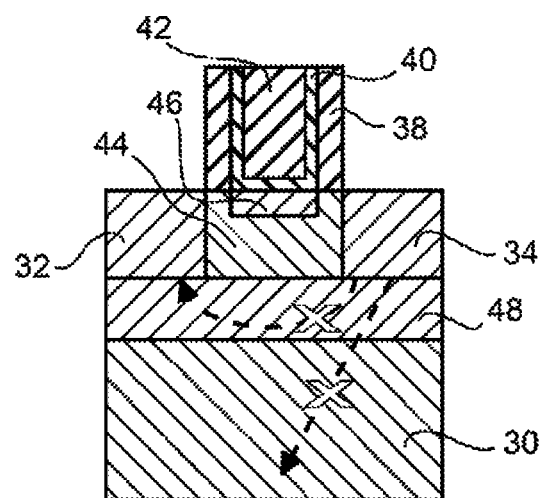
FIG. 66 schematically depicts usage phenomena associated with the embodiment of FIGS. 4-6.

By contrast, the silicon on nothing (SON) process provides full-isolation of fin structure from substrate. As shown in FIG. 66, these leakage paths are completely eliminated and off-state leakage current can be significantly reduced. However, since full-isolation of fin structure from substrate is achieved by selective etching of the sacrificial SiGe layer 33 beneath the Si fin, if the SiGe channel 46 is formed on fin structure prior to SiGe sacrificial film 33 selective etching step, the SiGe channel region 46 would also be etched.

Therefore full-isolation of fin structure and use of strained SiGe channel are not compatible on bulk-Si substrate. However, in preferred embodiments of the present invention, the SiGe channel is formed only after the fins have been fully isolated. Consequently, both high pFET performance by compressively-strained SiGe channel and low-leakage current by fully-isolated fin can be achieved simultaneously on bulk-Si substrate.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A semiconductor device, comprising:
   a three-dimensional channel region including a fin body comprising a core of a first semiconductor material and a cladding region that is an epitaxial covering of a second semiconductor material covering the core of the first semiconductor material on three sides of an upper part of the core of the first semiconductor material, the first and second semiconductor materials having respectively different lattice constants, thereby to create a strain in the epitaxial covering;
   a source region positioned adjacent one end of the three-dimensional channel region, and a drain region positioned adjacent an opposite end of the three-dimensional channel region; and
   a gate electrode superposed on the three-dimensional channel region,
   wherein the second semiconductor material is present in a region underlying the gate electrode, and
   the epitaxial covering of the second semiconductor material is recessed within the core of the first semiconductor material in cross-sectional view taken through the source region, the gate electrode, and the drain region, and
   the core and the cladding region that are made of the first and the second semiconductor materials having the respectively different lattice constants result in a valence band energy offset between the core and the cladding region, thereby suppressing off-state leakage current.

2. The semiconductor device according to claim 1, wherein each of the core and the epitaxial covering projects upwardly relative to an underlying substrate.

3. The semiconductor device according to claim 1, wherein the core is formed integrally with an underlying substrate of the first semiconductor material.

4. The semiconductor device according to claim 1, wherein the core is formed on an insulating layer of a semiconductor on insulator (SOI) substrate.

5. The semiconductor device according to claim 4, wherein each of the three-dimensional channel region, the source region, the drain region, and the gate electrode are separated from an underlying substrate by the insulating layer, thereby to form a transistor that is fully isolated from the underlying substrate.

6. The semiconductor device according to claim 1, wherein the first semiconductor material comprises silicon and germanium, and
wherein said second semiconductor material comprises silicon.

7. The semiconductor device according to claim 1, wherein the epitaxial covering of the second semiconductor material is surrounded on three sides by the core of the first semiconductor material in cross-sectional view perpendicular to a facing direction of the source region and the drain region.

8. A semiconductor device, comprising:
a three-dimensional channel region including a fin body comprising a core of a first semiconductor material and a cladding region that is an epitaxial covering of a second semiconductor material covering the core of the first semiconductor material on three sides of an upper part of the core of the first semiconductor material, the first and second semiconductor materials having respectively different lattice constants, thereby to create a strain in the epitaxial covering;
a source region positioned adjacent one end of the three-dimensional channel region, and a drain region positioned adjacent an opposite end of the three-dimensional channel region;
a gate electrode superposed on the three-dimensional channel region; and
a three-dimensional gate dielectric layer between the gate electrode and the three-dimensional channel region,
wherein the epitaxial covering of the second semiconductor material is recessed within the core of the first semiconductor material in cross-sectional view taken through the source region, the gate electrode, and the drain region, and
the core and the cladding region that are made of the first and the second semiconductor materials having the respectively different lattice constants result in a valence band energy offset between the core and the cladding region, thereby suppressing off-state leakage current.

9. The semiconductor device according to claim 8, wherein each of the core and the epitaxial covering projects upwardly relative to an underlying substrate.

10. The semiconductor device according to claim 8, wherein the core is formed integrally with an underlying substrate of the first semiconductor material.

11. The semiconductor device according to claim 8, wherein the core is formed on an insulating layer of a semiconductor on insulator (SOI) substrate.

12. The semiconductor device according to claim 11, wherein each of the three-dimensional channel region, the source region, the drain region, and the gate electrode are separated from an underlying substrate by the insulating layer, thereby to form a transistor that is fully isolated from the underlying substrate.

13. The semiconductor device according to claim 8, wherein the second semiconductor material has a larger lattice constant than the first semiconductor material, thereby to create a compressive strain in the epitaxial covering.

14. The semiconductor device according to claim 13, wherein the first semiconductor material comprises silicon and the second semiconductor material comprises silicon and germanium.

15. The semiconductor device according to claim 8, wherein the second semiconductor material has a smaller lattice constant than the first semiconductor material, thereby to create a tensile strain in the epitaxial covering.

16. The semiconductor device according to claim 15, wherein the first semiconductor material comprises silicon and germanium and wherein the second semiconductor material comprises silicon.

17. The semiconductor device according to claim 8, wherein the three-dimensional gate dielectric layer extends upwardly from the three-dimensional channel region, between the gate electrode and each of a pair of sidewall spacers.

18. The semiconductor device according to claim 8, wherein the three-dimensional channel region is repeated as a series of the channel regions, and wherein the gate electrode overlies plural channel regions within the series.

19. The semiconductor device according to claim 18, wherein the three-dimensional gate dielectric layer extends downwardly between adjacent channel regions within the series.

20. The semiconductor device according to claim 8, wherein the epitaxial covering of the second semiconductor material is surrounded on three sides by the core of the first semiconductor material in cross-sectional view perpendicular to a facing direction of the source region and the drain region.

* * * * *